Figure 1:
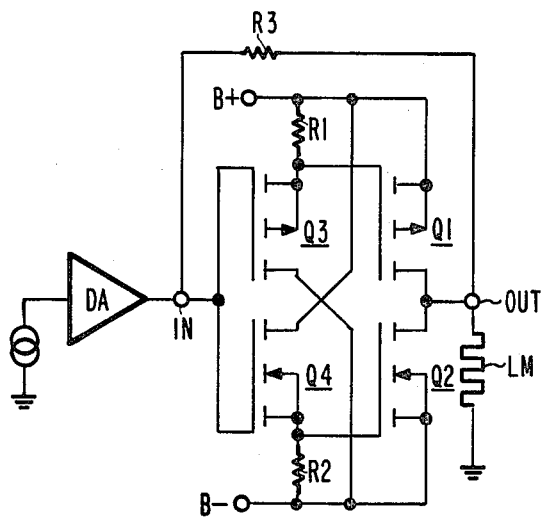

United States Patent [19]

Hoover

[11] 4,296,382
[45] Oct. 20, 1981

[54] CLASS AB PUSH-PULL FET AMPLIFIERS

[75] Inventor: Merle V. Hoover, Flemington, N.J.

[73] Assignee: RCA Corporation, New York, N.Y.

[21] Appl. No.: 108,027

[22] Filed: Dec. 28, 1979

[51] Int. Cl.³ .............................................. H03F 3/30
[52] U.S. Cl. .................................. 330/264; 330/265; 330/267
[58] Field of Search ................ 330/264, 265, 268, 267

[56] References Cited

U.S. PATENT DOCUMENTS

| | | | |
|---|---|---|---|
| 3,887,881 | 6/1975 | Hoffmann | 330/277 |
| 4,031,481 | 6/1977 | Yoshida | 330/269 |
| 4,038,607 | 7/1977 | Schade, Jr. | 330/264 |
| 4,068,090 | 1/1978 | Komatsu et al. | 179/1 A |

Primary Examiner—James B. Mullins
Attorney, Agent, or Firm—P. J. Rasmussen; A. L. R. Limberg; A. J. Jacobson

[57] ABSTRACT

The output stage of a quasi-linear amplifier employs a p-channel and an n-channel FET with their sources at relatively positive and relatively negative operating voltage rails to drive a load from their drain-to-drain connection, so that despite their being enhancement types full rail-to-rail output voltage capability can be obtained without need for bootstrapping. Input signal voltage and direct-coupled feedback voltage are applied to the gate-to-gate connection of p-channel and n-channel source-followers with their respective sources direct-coupled to the gate of the p-channel FET in the output stage and to the gate of the n-channel FET in the output stage, respectively, and with their respective drains connected to the relatively positive operating voltage rail and to the relatively negative operating voltage rail, respectively, in a representative driver stage.

21 Claims, 6 Drawing Figures

CLASS AB PUSH-PULL FET AMPLIFIERS

The present invention relates to transformerless Class AB push-pull quasi-linear amplifiers using p-channel and n-channel field effect transistors (FET's) with complementary enhancement-mode conduction characteristics, such as complementary metal-oxide-semiconductor (CMOS) types.

The use of FET's, rather than bipolar transistors, as output transistors in power amplifiers is advantageous because FET's do not require over-current or short-circuit-loading protection and are not as prone to thermal runaway problems. In audio power amplifier configurations field effect output transistors are preferable over bipolar types because their overload characteristics are more like those of thermionic valves and distort music and voice signals less objectionably in the judgment of critical listeners.

The complementary matching of depletion-mode conduction characteristics of CMOS p-channel and n-channel FET's constructed within the confines of a single integrated circuit tends not to be satisfactorily stable over a long term because of migration of the doping under the gates of such FET's, which migration occurs responsive to the thermal cycling that the FET's encounter during amplifier operation. This is particularly so where the degree of depletion for zero source-to-gate voltage ($OV_{GS}$) conditions is to be slight. So, from the viewpoint of assuring stable matching of complementary conduction characteristics, it is desirable to use enhancement-mode FET's in push-pull amplifier design.

In Class AB push-pull quasi-linear amplifiers each of the output transistors operated in push-pull with the other is arranged to conduct slightly under the no-signal, quiescent, or idling condition. This is done to avoid the cross-over distortion associated with either of the output transistors going out of conduction at the same time as the other, encountered in the Class B amplifiers. At the same time the idling currents flowing in the output transistors under no-signal conditions should be kept relatively low as compared to maximum output current conditions in the interest of amplifier efficiency.

Transformerless Class AB push-pull quasi-linear amplifiers constructed with PNP and NPN bipolar output transistors will normally use them in common-collector-amplifier connections to drive a load from their joined emitters. This is convenient to do because, since the bipolar collector currents ($I_C$'s) double for only 18 mV changes in their emitter-to-base voltages ($V_{BE}$'s) of around 650–700 mV, biasing arrangements for establishing stable quiescent $I_C$ values are conveniently obtained by connecting semiconductor voltage-regulating elements between their base electrodes to constrain the sum of their $V_{BE}$'s. Both transistors can simultaneously conduct only in controlled degree, and direct-coupled emitter-to-base feedback arrangements can adjust the relative conduction of the output transistors so they conduct similar-amplitude idling currents between collector and emitter. The FET analog of this type of push-pull amplifier employs p-channel and n-channel output FET's in common-drain-amplifier connections driving a load from their joined sources.

While the bipolar transistor exhibits exponential $I_C$ change with change in its $V_{BE}$, the FET exhibits square-law drain current ($I_D$) change with change in source-to-gate voltage ($V_{GS}$) at relatively low levels of $I_D$ and almost linear $I_D$ change with change in $V_{GS}$ at relatively high levels of $I_D$. In enhancement-mode FET's where the threshold value $V_T$ of $V_{GS}$ at which square-law operation commences, relatively large percentages of change in $V_{GS}$ are required to double $I_D$ as compared to the $100 \times (18 \text{ mV}/650 \text{ mV}) \doteq 3\%$ change in $V_{BE}$ required to double $I_C$ in a bipolar transistor. So, the desirability of avoiding direct potential translations between the control electrodes (i.e., base or gate electrodes) of the complementary conductivity output transistors, except insofar as these potentials are established by the offset voltages of diode-like semiconductor elements, in order to achieve stable idling currents through these transistors, which is so strong in complementary-conductivity bipolar transistor design, in much less strong in complementary-conductivity FET design, supposing the FET's to have pronounced enhancement-mode characteristics.

By FET standards, the bipolar transistor has relatively weak enhancement-mode characteristics, requiring very little forward bias of its input (base-emitter) port for conduction through its output (collector-emitter) port, and has very high transconductance. In amplifier arrangements when base drive voltages are constrained to the voltages between the relatively positive operating voltage at the collector of the NPN output transistor and the relatively negatively operating voltage at the collector of the PNP output transistor, the output signal voltage can swing over a range smaller than the difference of these operating voltages less the sum of the 650 to 700 mV $V_{BE}$ offsets of the output transistors. Since twice $V_{BE}$ is usually very much smaller than the several volt difference in the operating voltages, the reduction in output voltage swing, available power to the load, and amplifier efficiency are acceptably small. However, in an analogous FET amplifier where output signal swing is reduced by at least the sum of the $V_T$'s of two FET's, which is a few volts, the reduction tends to unacceptably reduce amplifier efficiency and available power to load. Boot-strapped drive arrangements or auxiliary driver stage power supply arrangements to permit increased gate drive voltages to the output FET's are somewhat over-complex solutions to this problem.

In push-pull amplifiers embodying the present invention the p-channel and n-channel output FET's have their source electrodes connected to a relatively positive operating voltage rail and to a relatively negative operating voltage rail, respectively, and have their drain electrodes connected together and to the output signal termainal. Strong forward gate drive to the p-channel output FET can pull the output signal terminal close in potential to the relatively positive operating voltage, or strong forward gate drive to the n-channel output FET can pull the output signal terminal close in potential to the relatively negative operating voltage. An output signal terminal connects by first potential translating means to the gate electrode of the p-channel output FET and by second potential translating means to the gate electrode of the n-channel output FET, and direct coupling from the output signal terminal to the input signal terminal completes a direct-coupled feedback loop for maintaining quiescent potential at the input signal terminal essentially midway between the relatively positive and relatively negative operating voltages. The first potential translating means is of a type permitting input signal potential swings from quiescent potential to relatively positive operating voltage to be suitably translated and applied to the gate of the n-channel output FET to operate that FET over a range from just above cut-off to full conduction, and the second potential translating means is of a type permitting input signal potential swings from quiescent potential to relatively negative operating voltage to be suitably translated and applied to the gate of the p-channel output FET to operate that FET over a range from just above cut-off to full conduction. Pull-up means are provided for pulling up the potential at the gate of the p-channel output FET for cutting off conduction in that FET as input signal potential swings positively respective to its quiescent value; and pull-down means are provided for pulling down the potential at the gate of the n-channel output FET for cutting off conduction in that FET as input signal potential swings negative respective to its quiescent value.

In the drawing:

Each of FIGS. 1, 2, 3, 4, 5 and 6 is a schematic diagram of a Class AB push-pull quasi-linear amplifier employing complementary-conductivity FET's and embodying the present invention.

In the FIG. 1 push-pull amplifier, p-channel FET Q1 and n-channel FET Q2 with source electrodes connected to B+ operating voltage rail and to B− operating voltage rail, respectively, serve as output transistors with their drain electrodes both connected to drive load means LM via output signal terminal OUT. Q1 and Q2 are enhancement-mode FET's with complementary conduction characteristics. So are p-channel FET Q3 and n-channel FET Q4, connected as common-drain amplifiers or source followers between an input signal terminal IN and the gates of Q1 and Q2, respectively. The gate-to-source voltage offset of Q3 translates the voltage at terminal IN in a positive direction for application to the gate of Q1, and the gate-to-source voltage offset of Q4 translates the voltage at terminal IN in a negative direction for application to the gate of Q2.

Resistor R1, with one end to which the source of Q3 and gate of Q1 are connected and with another end connected to the B+ rail, serves to pull-up the gate of Q1 when conduction through Q3 is reduced. But further, the resistance $R_1$ of resistor R1 is so chosen that, when the voltage at terminal IN is midway between B+ and B− operating voltages (ground, in the case of balanced operating voltage supplies), $V_{GS-Q3}$, the quiescent source-to-gate voltage of Q3, translates the voltage at terminal IN to a voltage offset from B+ operating voltage by a value close to the threshold voltage $V_{T-Q1}$ of FET Q1, exceeding it sufficiently to establish an idling current flow from source to drain of Q1. This connection of R1 also establishes Class A linear operation of source-follower transistor Q3 over at least most of the range of input signal voltage at terminal IN. Analogously, resistor R2, with one end to which the source of Q4 and gate of Q2 are connected and with another end connected to the B− rail, serves to pull down the gate of Q2 when conduction through Q4 is reduced. The resistance $R_2$ of R2 is so chosen that, when the voltage at terminal IN is midway between B− and B+ voltages, $V_{GS-Q4}$, the quiescent source-to-gate voltage of Q4 translates the voltage at terminal IN to a voltage offset from B− operating voltage by a value close to the threshold voltage $V_{T-Q2}$ of Q2, exceeding it sufficiently to establish an idling current flow from the drain of Q2 to its source. This connection of R2 also establishes Class A linear operation of source-follower transistor Q3 over at least most of the range of input signal voltage at terminal IN. Direct-coupled voltage feedback applied from terminal OUT to terminal IN will tend to adjust the quiescent voltage at terminal IN to a value midway between B− and B+ voltages, for equalizing the conduction of idling current through Q1 to the conduction of idling current through Q2; such direct coupled feedback is shown as being applied through resistor R3.

It is important to understand that the function of the common-drain-amplifier FET's Q3 and Q4 used to drive the gates of common-source-amplifier transistors Q1 and Q2, respectively, is quite different from the function of the common-collector-amplifier bipolar transistors that oftentimes are used to drive the bases of bipolar output transistors connected to operate in push-pull. The common-collector amplifier transistors are used principally to provide additional current gain before the output bipolar transistors and to provide matching for overcoming the low base input impedances of the output bipolar transistors. The transconductance of bipolar transistors is so relatively high and their degree of enhancement so relatively low—as compared to the FET's Q1, Q2, Q3 and Q4—that the series connection of the emitter-base junctions of a PNP output transistor, a PNP emitter-follower driver transistor, an NPN emitter-follower driver transistor and an NPN output transistor with output between the B+ and B− operating voltages associated with delivery of watts of power into conventional 2-, 4- and 8-ohm loads would lead to the thermal destruction of the transistors. That is, absent inclusion of substantial amounts of emitter degeneration, which would undesirably interfere with the capability to swing the output signal voltage at terminal OUT over a full range between B− and B+ operating voltages. The relatively low emitter-to-base offset voltage of a bipolar transistor is not very effective for potential translation when the difference between B− and B+ operating voltages is several volts.

One of the principal reasons for using source followers Q3 and Q4, on the other hand, is to provide potential translation capability approaching half the difference between the B− and B+ operating voltages. Scaling the area of the emitter base junction of a bipolar transistor down in size increases its $V_{BE}$ for given current flow, though not by much, owing to its relatively high transconductance and relatively low degree of enhancement and to its exponential collector current versus emitter-to-base voltage characteristics. Scaling down its collector area to reduce collection efficiency has little effect on its emitter-to-base voltage either. But scaling up the channel width and/or scaling down the channel length of an FET provides a wide range of $V_{GS}$ for given drain current level, particularly past the region of square-law operation, where the Class A linear source followers Q3 and Q4 are operated. FET's Q1, Q2, Q3 and Q4 are not current amplifiers, but simply transconductance amplifiers, having very high gate impedance and responding to charge between source and gate rather than to current. So, Q1 and Q2 are not current amplifiers to have current gains that must be augmented by preceding current amplifiers, nor are Q3 and Q4 current amplifiers that could provide such augmentation.

The connection of the drain of Q3 to B− rail permits its gate to go to (or even below) B− voltage on negative excursions of input signal voltage to terminal IN, so Q1 can be supplied a source-to-gate voltage $V_{GS-Q1}$ much larger than its threshold value $V_{T-Q1}$, that will render it fully conductive to clamp terminal OUT close to B+ voltage even if load means LM presents substantial loading. The connection of the drain of Q4 to B+ rail permits its gate to go to (or even above) B+ voltage on positive excursions of input signal voltage to terminal IN, so Q2 can be supplied a source-to-gate voltage $V_{GS\text{-}Q2}$ much larger than its threshold value $V_{T\text{-}Q2}$, that will render it fully conductive to clamp terminal OUT close to B− voltage even if load means LM presents substantial loading. Interconnection of the drain electrodes of Q3 and Q4 at ground is avoided since it constrains $V_{GS\text{-}Q1}$ and $V_{GS\text{-}Q2}$ to values no larger in amplitude than B+ and B− voltages, respectively.

The voltage gain of the FIG. 1 push-pull amplifier depends upon the source resistance $R_S$ of the driver amplifier DA supplying drive signal voltage $V_{IN}$ to terminal IN. Source-followers FET's Q3 and Q4 offer very high input impedance at their joined gate electrodes, as they will not accept current flow. Suppose relatively small change from quiescent voltage at terminal IN were required for a relatively large change $V_{OUT}$ from quiescent voltage at terminal OUT, which would be the case if terminal OUT were lightly loaded. Then the current flowing to terminal IN due to open-circuit voltage change of $V_{IN}$ from driver amplifier DA would be equal to $V_{IN}/R_S$. This current would equal the current flowing from terminal IN to terminal OUT, which would equal $V_{OUT}/R_3$. That is, the following equation would hold true.

$$V_{IN}/R_S = V_{OUT}/R_3$$

Solving for voltage gain, one would obtain the following ideal value.

$$(V_{OUT}/V_{IN}) = R_3/R_3$$

In practice, as the load presented by load means LM is increased, the open-loop voltage gain as between terminals IN and OUT is decreased. The closed-loop voltage gain between terminals IN and OUT will then be reduced from the $R_3/R_S$ value. It is to accommodate this condition that source-follower transistors Q3 and Q4 must be provided drain voltages allowing large input signal voltage swings at their gate electrodes.

The high gate impedances proffered by source-follower FET's Q3 and Q4 reduce loading effects upon the direct-coupled feedback from terminal OUT to terminal IN that would adversely affect amplifier non-linearity. To get more linear voltage amplification one arranges for the resistance $R_3$ of feedback resistor R3 to be proportional to the source resistance $R_S$ of driver amplifier DA. This goal can be furthered by padding the output terminal of the driver amplifier with a suitable resistor, if necessary.

Figure 2:
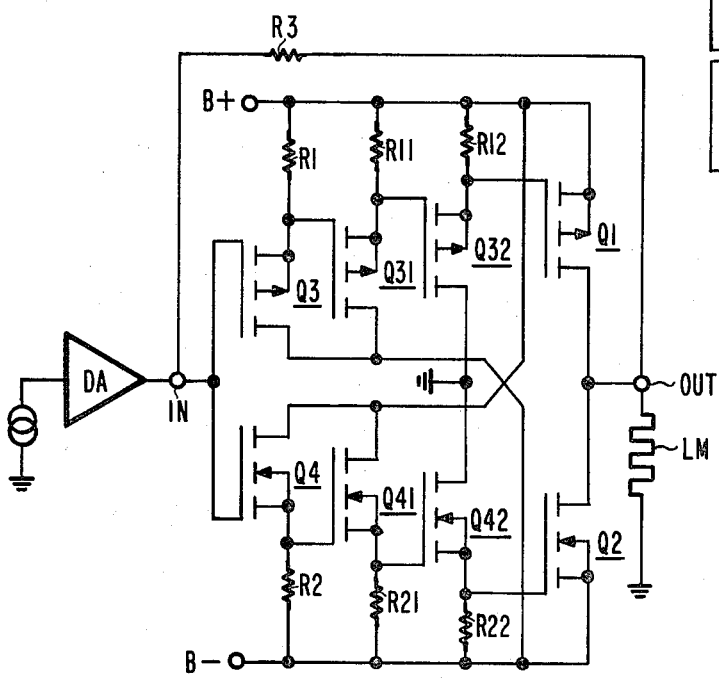

FIG. 2 shows one way to modify the FIG. 1 push-pull amplifier to accommodate B− and B+ operating voltages separated by large enough difference to make the FIG. 1 amplifier impractical. Additional source-follower transistors are inserted between the source of Q3 and gate of Q1 and between the source of Q4 and gate Q2. The latter source-follower transistors in each cascade connection may not have to have their gate potentials swing past the voltage midway between B− and B+ voltages (e.g., ground); if this is so, power consumption in the driver stages can be reduced by connecting the drains of those source-follower transistors together to receive voltage midway between B− and B+ voltages, rather than connecting them directly to B+ and B− supply rails. FIG. 2 shows two p-channel source-follower transistors Q31 and Q32 arranged in direct-coupled cascade connection between the source of Q3 and gate of Q1 and provided with source resistors R11 and R12 connecting their respective sources to B+ rail. FIG. 2 also shows two n-channel source follower transistors Q41 and Q42 arranged in direct-coupled cascade connection between the source of Q4 and gate of Q2 and provided with source resistors R21 and R22 connecting their respective sources to B− rail.

Figure 3:
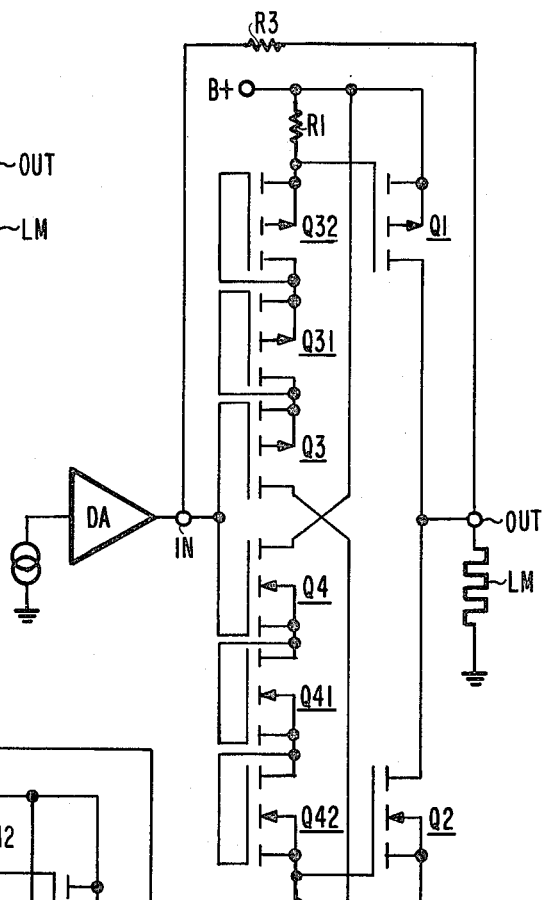

FIG. 3 shows a modification of the FIG. 2 circuit which connects Q31, Q32, Q41 and Q42 as diode elements rather than source followers, eliminating resistors R11, R12, R21 and R22 and reducing the number of current paths handling Class A signals to save quiescent power and thus boost amplifier efficiency. Amplifiers of the types shown in FIGS. 1, 2 and 3 are designed with rather well-defined differences between B− and B+ operating voltages in mind. Decreasing the difference between B− and B+ operating voltages tends to cause cross-over distortion, and increasing the difference leads to increased idling current through the channels of FET's Q1 and Q2 and reduced amplifier efficiency.

Figure 4:
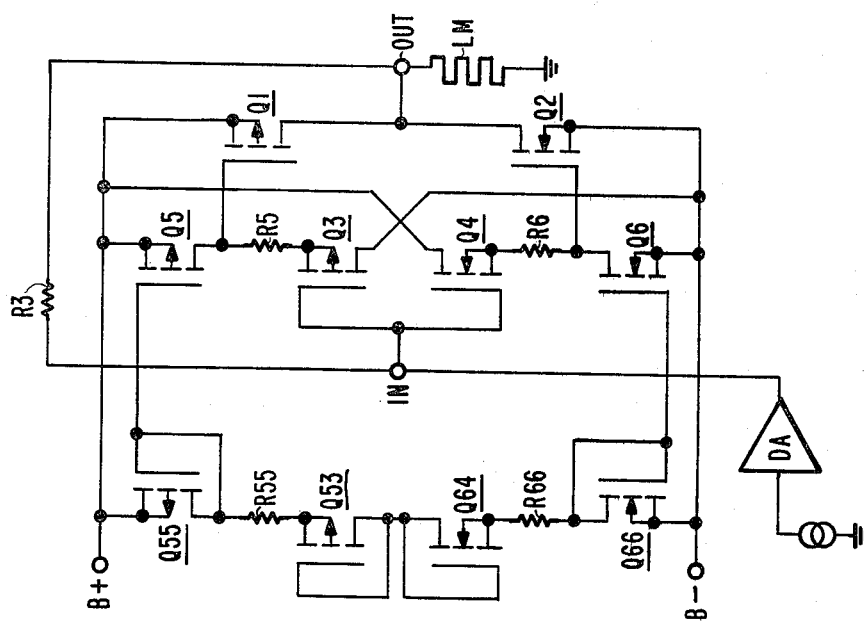

FIG. 4 shows a push-pull amplifier where idling current increases no more than linearly with the difference in B− and B+ operating voltages. P-channel FET Q5 is connected to provide means for pulling up the gate of Q1 as conduction in Q3 is reduced. Q5 also supplies drain current that flows through a resistor R5 between the gate of Q1 and source of Q3 to offset the potentials at these two electrodes by the amount B+ operating voltage exceeds the sum of quiescent $V_{GS\text{-}Q1}$ and $V_{GS\text{-}Q3}$. N-channel FET Q6 is connected to provide means for pulling down the gate of Q2 as conduction in Q4 is reduced. Q6 also demands drain current that flows through a resistor R6 between the gate of Q2 and source of Q4 to offset the potentials at these two electrodes by the amount B− operating voltage exceeds the sum of quiescent $V_{GS\text{-}Q2}$ and $V_{GS\text{-}Q4}$.

At the left of FIG. 4 there is a current path through the series connection of diode-connected p-channel FET Q55, resistor R55, diode-connected p-channel FET Q53, diode-connected n-channel FET Q64, resistor R66 and diode-connected n-channel FET Q66. Assume the resistance $R_{55}$ of resistor R55 to equal the resistance $R_{66}$ of resistor R66; and assume the conduction characteristics of Q55 and Q53 to be complementary to those of Q66 and Q64, respectively. Then, the interconnection between the drain electrodes of Q53 and Q64 will be at a virtual ground midway between B− and B+ operating potentials; the voltage drop across R55 will be equal to B+ minus the sum of the respective source-to-gate voltages $V_{GS\text{-}Q55}$ and $V_{GS\text{-}Q53}$ of Q55 and Q53, which can be made equal to the sum of quiescent $V_{GS\text{-}Q1}$ and $V_{GS\text{-}Q3}$ voltages; and the voltage drop across R66 will be equal to B− minus the sum of the respective source-to-gate voltages $V_{GS\text{-}Q66}$ and $V_{GS\text{-}Q64}$ of Q66 and Q64, which can be made equal to the sum of quiescent $V_{GS\text{-}Q2}$ and $V_{GS\text{-}Q3}$ voltages. The current flowing in the path at left of FIG. 4 is determined in accordance with Ohm's Law to be the potential drop across R55 and R66 divided by their respective resistances. Q55 and Q5 are in current mirror amplifier connection with each other. So, by scaling the conductances of R5 and R55 in the same ratio as the channel conductances of Q5 and Q55, the voltage drop across R5 will equal that across R55. Q66 and Q6 are in current mirror amplifier connection with each other; and by scaling the conductances of R6 and R66 in the same ratio as the channel conductances of Q6 and Q66, the voltage drop across R6 will equal that across R66.

Except for Q55 and Q66, the elements in the current path at left of FIG. 4 can be rearranged in their serial connection without affecting operation. This may be done so R55 and R66 can be consolidated to one resistive element.

Figure 5:
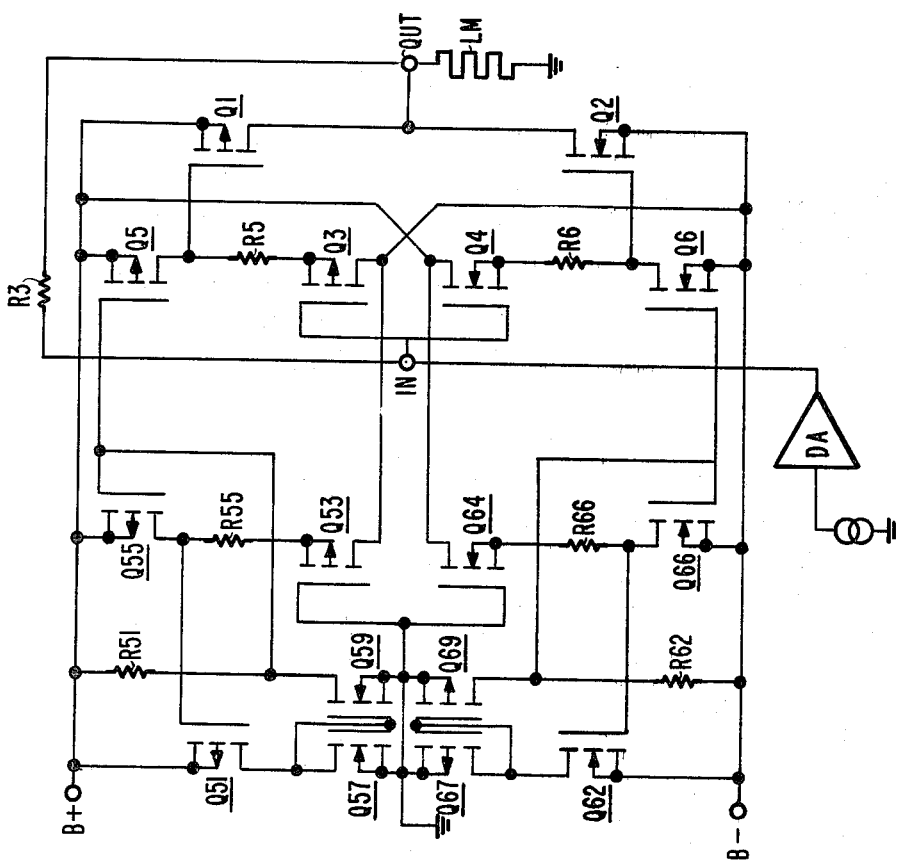

FIG. 5 shows how the FIG. 4 push-pull amplifier can be modified to afford more design freedom in choosing $V_{GS\text{-}Q55}$ different from $V_{GS\text{-}Q53}$ and in choosing $V_{GS\text{-}Q66}$ different from $V_{GS\text{-}Q64}$. Provision is also made for maintaining the idling current through the channels of Q1 and Q2 substantially less dependent upon the difference between B− and B+ voltages. The source-to-gate voltage $V_{GS\text{-}Q51}$ of FET Q51 emulates $V_{GS\text{-}Q1}$ under quiescent conditions and the resulting drain current $I_{D\text{-}Q51}$ of Q51 is reversed in direction of current flow by the current mirror amplifier (CMA) connection of n-channel FET's Q57 and Q59 to flow through resistor R51 connected between the gate and source electrodes of Q55. The voltage gain of the amplifier chain comprising the Q51 common-source amplifier, the CMA connection of Q57 and Q59, and R51 reduces the change in the source-to-drain voltage $V_{DS\text{-}Q55}$ of Q55 required to adjust $V_{GS\text{-}Q55}$ for accommodating increased demand for channel current as B+ voltage increases. The source-to-drain voltage $V_{DS\text{-}Q5}$ of Q5 parallelly operated with Q55 is similarly reduced, which voltage is identical with $V_{GS\text{-}Q1}$. So, in the FIG. 5 push-pull amplifier $V_{GS\text{-}Q1}$ variation with change in B+ voltage is reduced by the voltage gain of the amplifier chain comprising common-source-amplifier p-channel FET Q51, the CMA connection of n-channel FET's Q57 and Q59, and resistor R51, as compared to the FIG. 4 push-pull amplifier. Similarly, in the FIG. 5 push-pull amplifier $V_{GS\text{-}Q2}$ variation with change in B− voltage is reduced by the voltage gain of the amplifier chain comprising common-source-amplifier n-channel FET Q62, the CMA connection of P-channel FET's Q67 and Q69, and resistor R62, as compared to the FIG. 4 push-pull amplifier.

Figure 6:
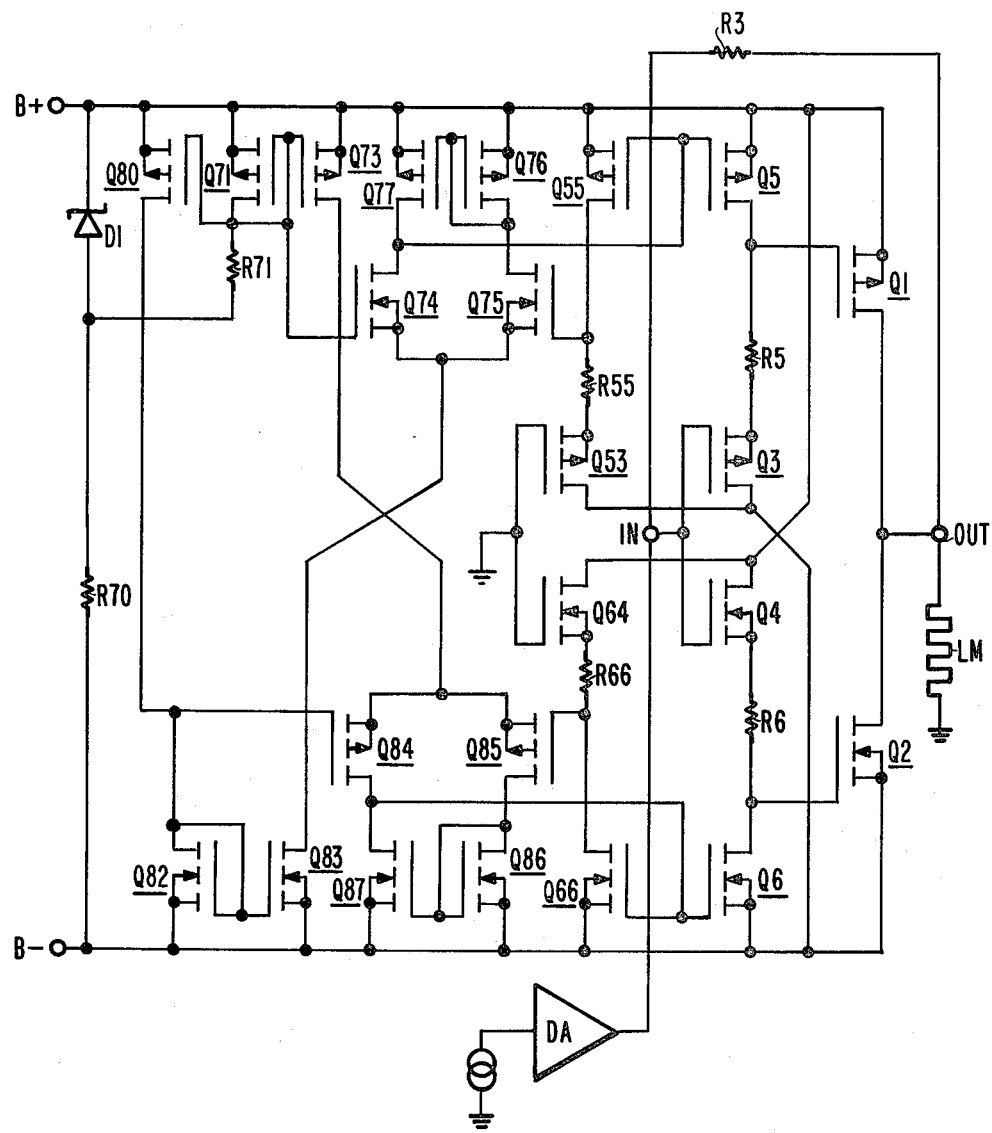

FIG. 6 shows a push-pull amplifier which exhibits substantially no change in the idling current through the channels of Q1 and Q2 with change in the difference between B− and B+ voltages. A junction D1 is reverse-biased to operate in avalanche breakdown, with cathode connected at B+ rail and with anode connected to B− rail through resistor R70 for limiting the flow of avalanche breakdown current. The avalanche breakdown voltage $V_z$ of D1 is applied to the series connection of a resistor R71 and a diode-connected p-channel FET Q71 with source at B+ rail. The relative conductances of these elements in series connection is chosen to establish the source-to-gate voltage $V_{GS\text{-}Q71}$ of Q71 equal to the desired quiescent value of $V_{GS\text{-}Q1}$. Diode-connected Q71 is in the input circuit of a dual-output CMA having the channels of p-channel FET's Q80 and Q73 in respective ones of its output circuits. The drain current of Q80 is used to forward-bias a diode-connected n-channel FET Q82 to establish its source-to-gate voltage $V_{GS\text{-}Q82}$ equal to the desired quiescent value of $V_{GS\text{-}Q2}$. Q82 is in the input circuit of a CMA having the channel of n-channel FET Q83 in its output circuit.

Q55 is connected in a shunt voltage regulator circuit for regulating its source-to-drain voltage $V_{DS\text{-}Q55}$ to equal $V_{GS\text{-}Q71}$. To this end $V_{DS\text{-}Q55}$ is compared to $V_{GS\text{-}Q71}$ by a long-tailed-pair connection of n-channel FET's Q74 and Q75, shown as being supplied tail current at their interconnected source electrodes from the drain of Q83. The resulting drain currents of Q74 and Q75 are differentially combined by the CMA connection of p-channel FET's Q76 and Q77 to control the gate potentials of Q5 and Q55. That is, Q74, Q75, Q76 and Q77 are connected to provide a differential-input amplifier with inverting input connection at the gate of Q74, non-inverting input connection at the gate of Q75 and with output connection from the interconnection between the drains of Q74 and Q77. If $V_{DS\text{-}Q55}$ tends to exceed $V_{GS\text{-}Q71}$ conduction will tend to be increased in Q74 and decreased in Q75, tending to increase $V_{GS\text{-}Q55}$ to decrease $V_{DS\text{-}Q55}$ until it equals $V_{GS\text{-}Q71}$. On the other hand, if $V_{DS\text{-}Q55}$ tends to be less than $V_{GS\text{-}Q71}$, conduction will tend to be increased in Q75 and decreased in Q74, tending to decrease $V_{GS\text{-}Q55}$ to increase $V_{DS\text{-}Q55}$ until it equals $V_{GS\text{-}Q71}$. Regulation of $V_{DS\text{-}Q55}$ to equal $V_{GS\text{-}Q71}$ will cause Q5, parallelly operated with Q55, to regulate its source-to-drain voltage $V_{DS\text{-}Q5}$ to equal $V_{GS\text{-}Q71}$, thereby applying the desired value of quiescent source-to-gate bias on Q1.

Similarly, Q66 is connected in a shunt voltage regulator circuit for regulating its source-to-drain voltage $V_{DS\text{-}Q66}$ to equal $V_{GS\text{-}Q82}$. To this end $V_{DS\text{-}Q66}$ is compared to $V_{GS\text{-}Q82}$ by a long-tailed-pair connection of p-channel FET's Q84 and Q85, shown as being supplied tail current at their interconnected source electrodes from the drain of Q73. The resulting drain currents of Q84 and Q85 are differentially combined by the CMA connection of n-channel FET's Q86 and Q87 to control the gate potentials of Q6 and Q66. That is, Q84, Q85, Q86 and Q87 are connected to provide a differential-input amplifier with inverting input connection at the gate of Q84, with non-inverting input connection at the gate of Q85, and with output connection from the interconnection between the drains of Q84 and Q87. Regulation of $V_{DS\text{-}Q66}$ to equal $V_{GS\text{-}Q82}$ will cause Q6, parallelly operated with Q66, to regulate its source-to-drain voltage $V_{DS\text{-}Q6}$ to equal $V_{GS\text{-}Q82}$, thereby applying the desired value of quiescent source-to-gate bias on Q2.

The FIGS. 4, 5 and 6 push-pull amplifiers can be modified to replace R5, R6, R55 and R66 with direct connections. The FIGS. 4, 5 and 6 push-pull amplifiers can be modified to replace each of resistors R5, R6, R55 and R66 with a respective diode-connected FET or with a series connection of the same number of diode-connected FET's. The drain connections of Q53 and Q64 shown in the FIG. 4 push-pull amplifier can alternatively be used in the FIG. 5 and FIG. 6 push-pull amplifiers, rather than the drain connections shown, with some saving of stand-by power consumption; and the drain-to-drain connection may be grounded, if desired. The drain connections of the FIGS. 5 and 6 push-pull amplifiers can be used in the FIG. 4 push-pull amplifier, rather than using drain interconnection, but the interconnected gates of Q53 and Q54 must be grounded or otherwise biased to a potential substantially midway between B− and B+ voltages.

The use in the push-pull amplifiers of FIGS. 4, 5 and 6 and in their variants of constant current generator means for supplying current at the drain of Q5 and for demanding current at the drain of Q6 reduces the modulation of $V_{GS\text{-}Q3}$ and $V_{GS\text{-}Q4}$ responsive to input voltage variation at terminal IN, as compared to the use of pull-up resistor R1 and pull-down resistor R2 in the push-pull amplifiers of FIGS. 1, 2 and 3. This increases the open-loop voltage gain of the amplifier slightly. A more important advantage of using the constant current generator means for pull-up and pull-down is that the power consumed in the driver stage does not increase appreciably for large $V_{GS-Q1}$ of $V_{GS-Q2}$ drive, so the amplifier can deliver a bit more maximum power for given B supply current delivery capability.

One skilled in the art and armed with the foregoing disclosure will readily design a variety of push-pull amplifiers differing somewhat from those shown, but embodying the present invention, and the scope of the following claims should be accordingly construed.

What is claimed is:

1. A Class AB quasi-linear push-pull amplifier comprising:
   first and second supply terminals for receiving a relatively positive operating voltage and a relatively negative operating voltage respectively;
   input and output signal terminals;
   a p-channel, field-effect output transistor with a source electrode connected at said first supply terminal, with a drain electrode connected at said output signal terminal, and with a gate electrode;
   an n-channel, field-effect output transistor with a source electrode connected at said second supply terminal, with a drain electrode connected at said output signal terminal, and with a gate electrode;
   first potential translating means for maintaining a positive direct offset potential between said input signal terminal and the gate electrode of said p-channel output transistor during quiescent conditions and during positive excursions of input signal, which means includes a p-channel, field-effect source-follower transistor having the potential at said signal input terminal applied without translation to its gate electrode, and
   a number N, at least one, of first forward-poled field-effect transistors having gate-source paths connected between the source electrode of said p-channel source-follower transistor and the gate electrode of said p-channel output transistor;
   second potential translating means for maintaining a negative direct offset potential between said input signal terminal and the gate electrode of said n-channel output transistor during quiescent conditions and during negative excursions of input signal, which means includes an n-channel, field-effect source-follower transistor having the potential at said input signal terminal applied without translation to its gate electrode, and
   means for maintaining the quiescent potential at said input signal terminal at a potential between said relatively positive and relatively negative operating voltages, which means includes:
   a direct-coupled feedback connection from said output signal terminal to said input signal terminal;
   pull-up means for pulling up the potential at the gate electrode of said p-channel output transistor during substantially positive excursions of input signal; and
   pull-down means for pulling down the potential at the gate electrode of said n-channel output transistor during substantially negative excursions of input signal.

2. A Class AB quasi-linear push-pull amplifier as set forth in claim 1 wherein said n-channel source-follower transistor has a gate electrode connected at said input signal terminal, has a source electrode connected to the gate electrode of said n-channel output transistor, and has a drain electrode connected to said first supply terminal;
   and wherein said p-channel source-follower transistor has a gate electrode connected at said input signal terminal, and has a drain electrode connected to said second supply terminal.

3. A Class AB quasi-linear push-pull amplifier as set forth in claim 1 or 2 wherein said pull-up means comprises a first resistive element with a first end connected at said first supply terminal and with a second end connected at the gate electrode of said p-channel output transistor; and wherein said pull-down means comprises a second resistive element with a first end connected at said second supply terminal and with a second end connected at the gate electrode of said n-channel output transistor.

4. A Class AB quasi-linear push-pull amplifier as set forth in claim 1 wherein
   said [first potential translating means includes:] at least one first forward-poled field-effect transistor is a further p-channel field-effect source-follower transistor [preceding,] in direct-coupled cascade between said input signal terminal and the gate electrode of said p-channel output transistor, [that p-channel field-effect source-follower transistor already claimed hereinafter referred to as the ultimate p-channel field-effect source-follower transistor;] and wherein
   said [second potential translating means includes:] at least one second forward-poled field-effect transistor is a further n-channel field-effect source-follower transistor [preceding,] in direct-coupled cascade between said input signal terminal and the gate electrode of said n-channel output transistor[, that n-channel field-effect source-follower transistor already claimed hereinafter referred to as the ultimate n-channel field-effect source-follower transistor].

5. A Class AB quasi-linear amplifier as set forth in claim 4 wherein at least one of said p-channel source-follower transistors, including that one with gate electrode most directly connected to said input signal terminal, has its drain electrode connected to said second supply terminal; and wherein at least one of said n-channel source-follower transistors, including that one with gate electrode most directly connected to said input signal terminal; has its drain electrode connected to said first supply terminal.

6. A Class AB quasi-linear push-pull amplifier as set forth in claim 1 or 2 wherein said pull-up means and said pull-down means are provided by constant current generator means having a first output connection for supplying current connected at the gate of said p-channel output transistor and having a second output connection for demanding current connected at the gate of said n-channel transistor.

7. A Class AB push-pull quasi-linear amplifier comprising:
   first and second supply terminals for receiving a relatively positive operating voltage and a relatively negative operating voltage, respectively;
   input and output signal terminals;
   first, second, third and fourth field-effect transistors each having respective gate, source, and drain electrodes said first and third field-effect transistors being p-channel field-effect transistors and said second and fourth field-effect transistors being n-channel field-effect transistors, the conduction characteristics of said first and second transistors being complementary to each other, the conduction characteristics of said third and fourth transistors being complementary to each other, the respective source electrodes of said first and second transistors being respectively connected to said first supply terminal and to said second supply terminal and their respective drain electrodes being both connected to said output signal terminal;

means for maintaining a quiescent potenital at said input signal terminal substantially midway between said relatively positive and relatively negative operating voltages;

means for applying the potential at said input signal terminal without translation to the respective gate electrodes of said third and fourth transistors;

means for applying the source potential of said third transistor to the gate electrode of said first transistor including first potential translating means for developing a translating potential therebetween;

means for applying the source potential of said fourth transistor to the gate electrode of said second transistor including second potential translating means for developing a translating potential therebetween;

means applying a potential to the drain electrode of said third transistor which is appreciably more negative than the quiescent potential at said input signal terminal for maintaining saturation in said third transistor despite negative input signal excursions at said input signal terminal which are substantially larger than the threshold voltage of said second transistor; and means applying a potential to the drain electrode of said fourth transistor which is appreciably more positive than the quiescent potential at said input signal terminal for maintaining saturation in said fourth transistor despite positive input signal excursions at said input signal terminal which are substantially larger than the threshold voltage of said first transistor.

8. A Class AB push-pull quasi-linear amplifier as set forth in claim 7 wherein said first potential translating means includes a first potential follower, and wherein said second potential translating means includes a second potential follower.

9. A Class AB quasi-linear push-pull amplifier as set forth in claim 7 or 8 wherein said means for applying a potential to the drain electrode of said third transistor consists of a connection of the drain electrode of said third transistor to said second supply terminal, and wherein said means for applying a potential to the drain electrode of said fourth transistor consists of a connection of the drain electrode of said fourth transistor to said first supply terminal.

10. A Class AB quasi-linear push-pull amplifier comprising:

first, second, third and fourth p-channel field-effect transistors and first, second, third and fourth n-channel field-effet transistors, each having respective source and drain electrodes defining the ends of its conductive channel and having a respective gate electrode, p-channel and n-channel transistors having the same ordinal number exhibiting complementary conduction characteristics to each other;

an input signal terminal at an interconnection between the gate electrodes of said first p-channel and first n-channel transistors;

an output signal terminal to which the drain electrodes of said second p-channel and second n-channel transistors connect;

a first supply terminal for receiving a relatively positive operating voltage to which the source electrodes of said second, third and fourth p-channel transistors and the drain electrode of said first n-channel transistor connect;

a second supply terminal for receiving a relatively negative operating voltage to which the source electrodes of said second, third, and fourth n-channel transistors and the drain electrode of said first p-channel transistor connect;

means for establishing a quiescent potential at said input signal terminal substantially midway between said relatively positive and relatively negative operating voltages;

a first node, the voltage at which is applied to the gate electrode of said second p-channel transistor, to which first node the drain electrode of said third p-channel transistor connects;

first conductive means between the source electrode of said first p-channel transistor and said first node;

a second node, the voltage of which is applied to the gate electrode of said second n-channel transistor, to which second node the drain electrode of said third n-channel transistor connects;

second conductive means between the source electrode of said first n-channel transistor and said second node;

a third node to which the drain electrode of said fourth p-channel transistor connects;

a fourth node to which the drain electrode of said fourth n-channel transistor connects;

resistive means between said third and fourth nodes;

first degenerative feedback applying means, responsive to the potential between said first supply terminal and said third node tending to exhibit a departure from a predetermined value for applying a corrective potential to an interconnection between the gate electrodes of said third and fourth p-channel transistors to degenerate that departure; and second degenerative feedback applying means, responsive to the potential between said second supply terminal and said fourth node tending to exhibit a departure from a predetermined value for applying a corrective potential to an interconnection between the gate electrodes of said third and fourth n-channel transistors.

11. A Class AB quasi-linear push-pull amplifier as set forth in claim 10 wherein said resistive means comprises diode-connected fifth p-channel and fifth n-channel field-effect transistors in series connection with third conductive means between said third and fourth nodes.

12. A Class AB quasi-linear push-pull amplifier as set forth in claim 10 or 11 wherein said first degenerative feedback applying means is a direct connection of said third node to the interconnection between the gate electrodes of said third and fourth p-channel transistors, and wherein said second degenerative feedback applying means is a direct connection of said fourth node to the interconnection between the gate electrodes of said third and fourth n-channel transistors.

13. A Class AB quasi-linear amplifier as set forth in claim 10 wherein said resistive means comprises:

fifth p-channel and fifth n-channel field-effect transistors, each having respective source and drain electrodes defining the ends of its conductive channel and having a respective gate electrode;

means for establishing a quiescent potential at an interconnection between the gate electrodes of said fifth p-channel and fifth n-channel transistors, which potential is substantially midway between said relatively positive and relatively negative operating voltages;

means for applying drain potentials to said fifth p-channel and fifth n-channel transistors;

third conductive means between the source electrode of said fifth p-channel transistor and said third node; and fourth conductive means between the source electrode of said fifth n-channel transistor and said fourth node.

14. A Class AB quasi-linear push-pull amplifier as set forth in claim 13 wherein said means for applying drain potentials to said fifth p-channel and fifth n-channel transistors includes an interconnection of the drain electrodes of those transistors.

15. A Class AB quasi-linear push-pull amplifier as set forth in claim 13 wherein said means for applying drain potentials to said fifth p-channel and fifth n-channel transistors includes a connection of the drain electrode of said fifth p-channel transistor to said second supply terminal and includes a connection of the drain electrode of said fifth n-channel transistor to said first supply terminal.

16. A Class AB quasi-linear push-pull amplifier as set forth in claim 13 wherein said first degenerative feedback applying means comprises:

a sixth p-channel field-effect transistor having a gate electrode to which the potential at said third node is applied, having a source electrode connected to said first supply terminal, and having a drain electrode;

a first inverting current amplifier having an input connection from the drain electrode of said sixth p-channel field-effect transistor and having an output connection to an interconnection between the gate electrodes of said third and fourth p-channel transistors; and first resistive load means between that interconnection and said first supply terminal—and wherein said second degenerative feedback applying means comprises:

a sixth n-channel field-effect transistor having a gate electrode to which the potential at said fourth node is applied, having a source electrode connected to said second supply terminal, and having a drain electrode;

a second inverting current amplifier having an input connection from the drain of said sixth n-channel field-effect transistor and having an output connection to an interconnection between the gate electrodes of said third and fourth n-channel field-effect transistors; and second resistive load means between that interconnection and said second supply terminal.

17. A Class AB quasi-linear push-pull amplifier as set forth in claim 13 wherein said first degenerative feedback applying means comprises:

a first differential-input amplifier having an inverting input connection, having a non-inverting input connection to which the potential at said third node is applied, and having an output connection to the interconnection between the gate electrodes of said third and fourth p-channel transistors; and first potential offsetting means for offsetting the potential at the inverting input connection of said first differential-input amplifier from said relatively positive operating voltage by said predetermined value of potential between said first supply terminal and said third node—and wherein said second degerative feedback supplying means comprises:

a second differential-input amplifier having an inverting input connection, having a non-inverting input connection to which the potential at said fourth node is applied, and having an output connection to the interconnection between the gate electrodes of said third and fourth n-channel transistors; and second potential offsetting means for offsetting the potential at the inverting input connection of said second differential-input amplifier from said relatively negative operating voltage by said predetermined value of potential between said second supply terminal and said fourth node.

18. A Class AB quasi-linear push-pull amplifier as set forth in claim 17 wherein said first potential offsetting means comprises:

a sixth p-channel field-effect transistor having a source electrode connected to said first supply terminal and having drain and gate electrodes with an interconnection therebetween connected to the inverting input connection of said first differential-input amplifier; and means for applying negative biasing current to the interconnection between the drain and gate electrodes of said sixth p-channel transistor—and wherein said second potential offsetting means comprises:

a sixth n-channel field-effect transistor having a source electrode connected to said second supply terminal and having drain and gate electrodes with an interconnection therebetween connected to the inverting input connection of said second differential-input amplifier; and means for applying positive biasing current to the interconnection between the drain and gate electrodes of said sixth n-channel transistor.

* * * * *

UNITED STATES PATENT AND TRADEMARK OFFICE
CERTIFICATE OF CORRECTION

PATENT NO. : 4,296,382
DATED : October 20, 1981
INVENTOR(S) : Merle Vincent Hoover It is certified that error appears in the above—identified patent and that said Letters Patent is hereby corrected as shown below:

| | |
|---|---|
| Column 2, Line 6 | "100X(18mV/650mV)$\dot{=}$3%" should be -- 100x(18mV/650mV) $\stackrel{\triangle}{=}$3% -- ; |
| Column 2, Line 15 | "in" should be -- is -- ; |
| Column 5, Line 35 | "$(V_{OUT}/V_{IN})=R_3/R_3$" should be -- $(V_{OUT}/V_{IN}) = R_3/R_S$ -- ; |
| Column 9, Line 51 | after "and" insert the following paragraph -- a number N of second forward-poled field-effect transistors having gate-source paths connected between the source electrode of said n-channel source-follower transistor and the gate electrode of said n-channel output transistor; -- ; |
| Column 10, Lines 2 & 3 | delete "has a source electrode connected to the gate electrode of said n-channel output transistor," |
| Column 10, Line 22 | delete "[first potential translating means includes:]" ; |

UNITED STATES PATENT AND TRADEMARK OFFICE
CERTIFICATE OF CORRECTION

PATENT NO. : 4,296,382         Page 2 of 3

DATED : October 20, 1981

INVENTOR(S) : Merle Vincent Hoover      Sheet #2

It is certified that error appears in the above—identified patent and that said Letters Patent is hereby corrected as shown below:

| | |
|---|---|
| Column 10, Line 25 | delete "[preceding,]" ; |
| Column 10, Lines 28-31 | delete "[that p-channel field-effect source-follower transistor already claimed hereinafter referred to as the ultimate p-channel field-effect source-follower transistor;]" ; |
| Column 10, Line 31 | before "and" insert a semicolon -- ; -- ; |
| Column 10, Line 32 | delete "[second potential translating means includes:]" ; |
| Column 10, Line 35 | delete "[preceding,]" ; |
| Column 10, Lines 37-41 | delete "[, that n-channel field-effect source-follower transistor already claimed hereinafter referred to as the ultimate n-channel field-effect source-follower transistor]" ; |
| Column 11, Line 1 | after "electrodes" insert a comma -- , -- ; and |

UNITED STATES PATENT AND TRADEMARK OFFICE
CERTIFICATE OF CORRECTION

PATENT NO. : 4,296,382

DATED : October 20, 1981

INVENTOR(S) : Merle Vincent Hoover

It is certified that error appears in the above—identified patent and that said Letters Patent is hereby corrected as shown below:

Column 11, Line 14   change "potenital" to -- potential -- .

Signed and Sealed this

Thirtieth Day of March 1982

|SEAL|

Attest:

GERALD J. MOSSINGHOFF

Attesting Officer   Commissioner of Patents and Trademarks